US010700678B2

(12) United States Patent
Horiguchi et al.

(10) Patent No.: US 10,700,678 B2
(45) Date of Patent: Jun. 30, 2020

(54) DRIVE CONTROL CIRCUIT FOR POWER SEMICONDUCTOR ELEMENT

(71) Applicant: Mitsubishi Electric Corporation, Chiyoda-ku (JP)

(72) Inventors: Takeshi Horiguchi, Chiyoda-ku (JP); Yasushi Nakayama, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 411 days.

(21) Appl. No.: 15/572,927

(22) PCT Filed: May 30, 2016

(86) PCT No.: PCT/JP2016/065891
§ 371 (c)(1),
(2) Date: Nov. 9, 2017

(87) PCT Pub. No.: WO2016/203937
PCT Pub. Date: Dec. 22, 2016

(65) Prior Publication Data
US 2018/0115310 A1    Apr. 26, 2018

(30) Foreign Application Priority Data
Jun. 16, 2015  (JP) ................. 2015-120848

(51) Int. Cl.
*H02H 9/00*          (2006.01)
*H03K 17/082*     (2006.01)
(Continued)

(52) U.S. Cl.
CPC ......... *H03K 17/0822* (2013.01); *G01R 31/27* (2013.01); *H02M 1/00* (2013.01);
(Continued)

(58) Field of Classification Search
CPC ............. H03K 17/0828; H03K 17/082; H03K 17/166; H03K 17/168; G01R 31/27; H02M 1/00; H02M 1/08
(Continued)

(56) References Cited

U.S. PATENT DOCUMENTS 6,057,728 A * 5/2000 Igarashi ............. H03K 17/0828
327/546
2004/0027762 A1   2/2004 Ohi et al.

FOREIGN PATENT DOCUMENTS

JP    2001-197724 A    7/2001
JP    3883925 B2       2/2007
JP    2007-259533 A   10/2007

OTHER PUBLICATIONS

International Search Report dated Aug. 16, 2016 in PCT/JP2016/065891, filed on May 30, 2016.

* cited by examiner

*Primary Examiner* — Thienvu V Tran
*Assistant Examiner* — Lucy M Thomas
(74) *Attorney, Agent, or Firm* — Oblon, McClelland, Maier & Neustadt, L.L.P.

(57) ABSTRACT

A voltage driver shifts a voltage on a gate as a control terminal of a power semiconductor element in response to an ON command or an OFF command. A gate voltage detector generates a detection signal of a gate-emitter voltage. A delay signal generator generates a delay signal obtained by adding a delay time to the detection signal. A subtractor generates a voltage difference signal between the detection signal and the delay signal. When the voltage difference signal exceeds a reference voltage during an operation of turning on the power semiconductor element, a short-circuit state detector detects a hard-switching fault.

13 Claims, 16 Drawing Sheets

(51) Int. Cl.
*H02M 1/08* (2006.01)
*H02M 1/00* (2006.01)
*H03K 17/16* (2006.01)
*G01R 31/27* (2006.01)

(52) U.S. Cl.
CPC .......... *H02M 1/08* (2013.01); *H03K 17/0828* (2013.01); *H03K 17/166* (2013.01); *H03K 17/168* (2013.01)

(58) Field of Classification Search
USPC ........................................................ 361/52
See application file for complete search history.

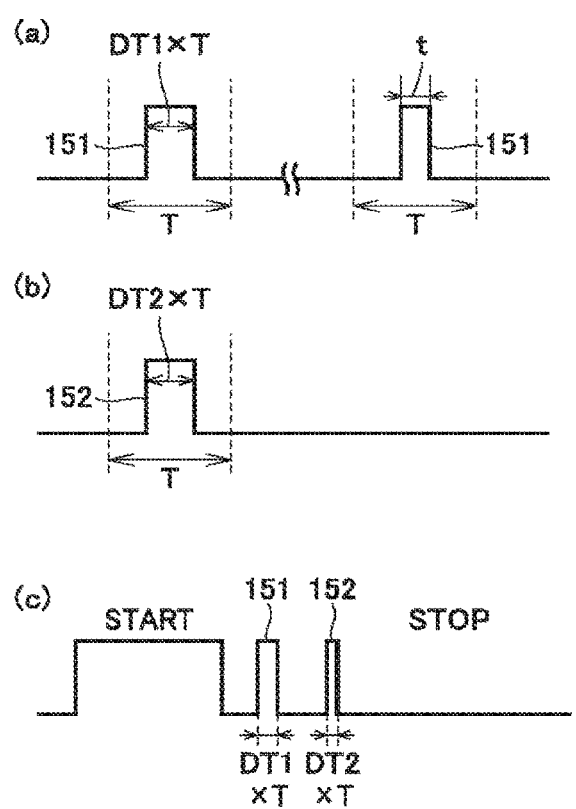

DRIVE CONTROL CIRCUIT FOR POWER SEMICONDUCTOR ELEMENT

TECHNICAL FIELD

The present invention relates to a drive control circuit for a power semiconductor element, and particularly to a drive control circuit having a function of detecting a hard-switching fault (short-circuit state in the power semiconductor element) such as an insulated gate bipolar transistor (IGBT) and a metal oxide semiconductor field effect transistor (MOSFET).

BACKGROUND ART

When a hard-switching fault occurs, a high short-circuit current flows through a power semiconductor element such as an IGBT and a MOSFET, which may cause thermal destruction of the power semiconductor element. Accordingly, there is a need for functions of detecting a short-circuit state in the power semiconductor element, and protecting the power semiconductor element.

PTD 1 (Japanese Patent Laying-Open No. 2001-197724) discloses a drive circuit for a power semiconductor element. The drive circuit is configured to detect a voltage across main terminals of the power semiconductor element (a collector-emitter voltage in an IGBT) to determine that an overcurrent state or a short-circuit state occurs when the voltage across the main terminals is higher than a prescribed determination value.

PTD 2 (Japanese Patent Laying-Open No. 2007-259533) discloses a protection circuit configured to detect a collector current and a gate-emitter voltage in a power semiconductor element (IGBT). Under the hard-switching fault operating condition, the gate-emitter voltage rises to a gate drive power supply voltage at once, and a high collector current flows therethrough. Accordingly, when the gate-emitter voltage is higher than a prescribed voltage that is set in advance, and when the collector current value is higher than a prescribed current value that is set in advance, it is determined that the hard-switching fault occurs.

On the other hand, PTD 3 (U.S. Pat. No. 3,883,925) discloses a configuration of a drive circuit for detecting a hard-switching fault only based on the gate-emitter voltage of a power semiconductor element (IGBT). Particularly, in the hard-switching fault, the so-called mirror period observed under the normal operating condition does not appear. Accordingly, the hard-switching fault is detected as the gate-emitter voltage exceeds a reference value in the detection time period corresponding to a mirror period.

CITATION LIST

Patent Document

PTD 1: Japanese Patent Laying-Open No. 2001-197724 (paragraphs [0022] to [0028], and FIGS. 1 to 3)
PTD 2: Japanese Patent Laying-Open No. 2007-259533 (paragraphs [0013] to [0017], and FIG. 1)
PTD 3: U.S. Pat. No. 3,883,925 (paragraphs [0023] to [0026], and [0034])

SUMMARY OF INVENTION

Technical Problem

The drive circuit disclosed in PTD 1 is configured to detect the collector-emitter voltage on the power semiconductor element, thereby detecting that a hard-switching fault occurs. However, for distinguishing between the normal operation and the hard-switching fault, the determining operation cannot be performed for a certain time period since after the turn-on operation. This possesses a problem that it takes a long time to detect a hard-switching fault. Furthermore, it is necessary to use a high voltage diode as means for detecting a collector-emitter voltage, which also possesses a problem of cost increase.

The protection circuit in PTD 2 is configured to use a collector current and a gate-emitter voltage to thereby detect that a hard-switching fault occurs. As a result, two control amounts needs to be detected, which leads to a problem that the device is increased in size and cost.

For the drive circuit in PTD 3, it becomes necessary to set the detection period so as to be associated with the physical parameters of the power semiconductor element and the drive circuit in order to prevent misdetection of a hard-switching fault. Thus, when the detection period is set inappropriately, the drive circuit may fail to detect the hard-switching fault or may make a misdetection.

The present invention has been made to solve the above-described problems. An object of the present invention is to provide a drive control circuit capable of inexpensively, immediately and accurately detecting a short-circuit state in a power semiconductor element.

Solution to Problem

A drive control circuit for a power semiconductor element according to the present invention is provided as a drive control circuit for a power semiconductor element including a control terminal. The drive control circuit includes a driver, a detector, a delay signal generator, a subtractor, and a short-circuit state detector. The driver applies a voltage to the control terminal in response to an ON command or an OFF command. The detector is configured to detect an electrical quantity of the control terminal. The delay signal generator is configured to generate a delay signal obtained by adding a delay time to a detection signal of the electrical quantity detected by the detector. The subtractor is configured to generate a difference signal between the detection signal and the delay signal. The short-circuit state detector is configured to detect a hard-switching fault based on a result of comparison between the difference signal and a reference value when the driver is operated in response to the ON command.

By providing such a configuration, based on whether the peak value of the difference signal between the delay signal and the detection signal of a single electrical quantity in the control terminal exceeds a reference voltage or not, a hard-switching fault can be detected without having to combine time conditions. Therefore, the hard-switching fault can be detected accurately at low cost. Furthermore, the peak value of the difference signal occurs at the time when the electrical quantity behavior significantly varies between the normal operation and the hard-switching fault, that is, at the beginning of the mirror period. Accordingly, a hard-switching fault can be detected immediately after turn-on operation.

Advantageous Effects of Invention

According to the present invention, a hard-switching fault can be inexpensively, immediately and accurately detected.

BRIEF DESCRIPTION OF DRAWINGS

FIG. 18 is a table showing the correspondence relation between a select signal and output data from an output terminal in the drive control circuit shown in FIG. 17.

FIG. 19 is a diagram illustrating an example of the output data (analog) from the output terminal in the drive control circuit shown in FIG. 17.

DESCRIPTION OF EMBODIMENTS

The embodiments of the present invention will be hereinafter described in detail with reference to the accompanying drawings.

First Embodiment

Figure 1:
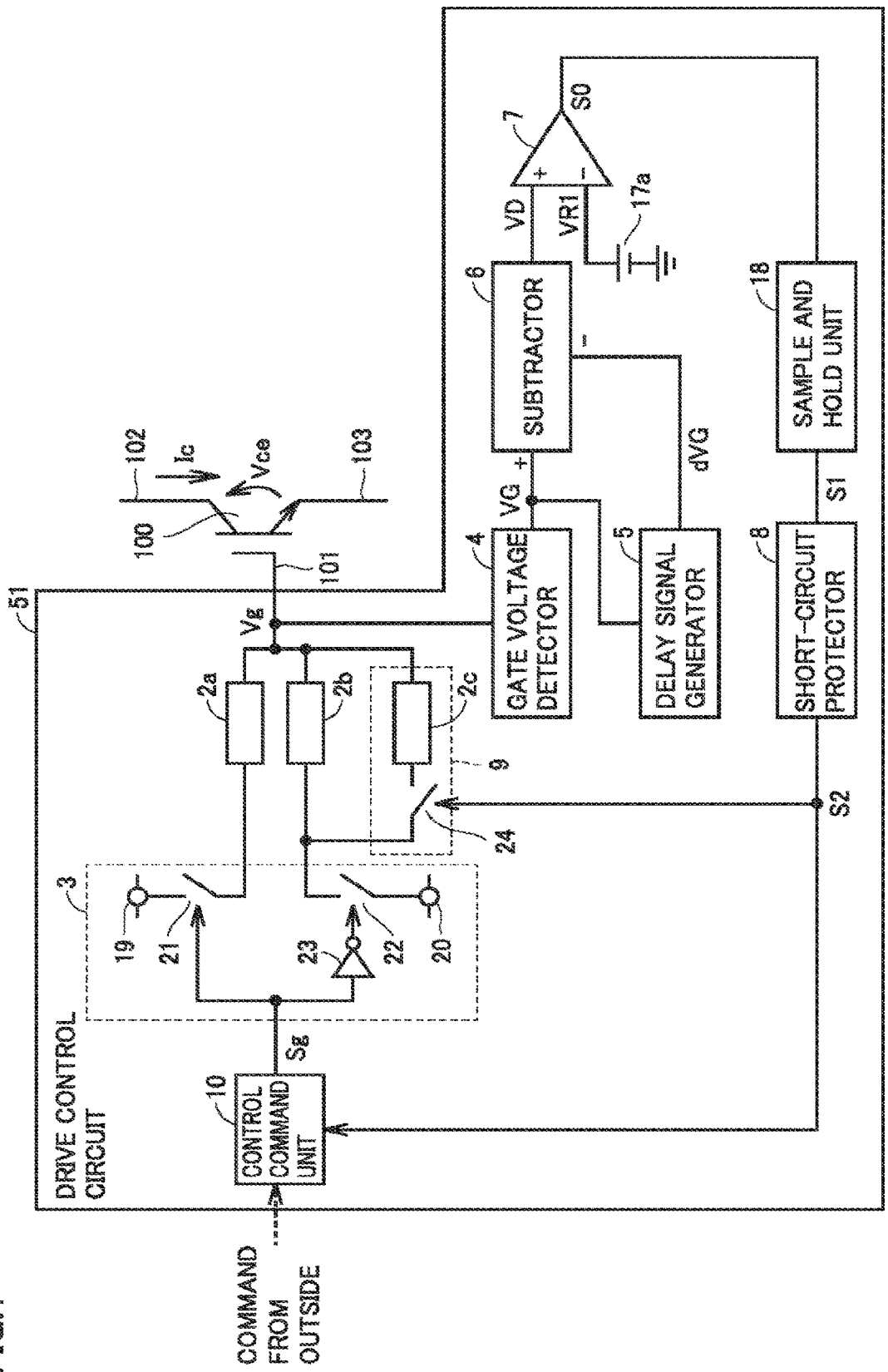
FIG. 1 is a block diagram showing the configuration of a drive control circuit for a power semiconductor element according to the first embodiment of the present invention.

FIG. 1 is a block diagram showing the configuration of a drive control circuit for a power semiconductor element according to the first embodiment of the present invention.

Referring to FIG. 1, a drive control circuit 51 according to the first embodiment controls a power semiconductor element 100 to be turned on and off. In the following description, an IGBT is exemplified as power semiconductor element 100. Thus, according to the voltage on a gate 101 serving as a "control terminal", power semiconductor element 100 is controlled to be brought into a "closed state (ON)" or an "opened state (OFF)". In the "closed state (ON)", a current path is formed between a collector 102 and an emitter 103 each of which is a "main terminal". In the "opened state (OFF)", the current path is interrupted. Power semiconductor element 100 is not limited to an IGBT, but may be a fully controllable power semiconductor element such as a MOSFET.

First, an explanation will be hereinafter given with regard to the configuration of a circuit portion that is included in the configuration of drive control circuit 51 and configured to control power semiconductor element 100 to be turned on and off Drive control circuit 51 includes a control command unit 10, a voltage driver 3, gate resistors 2a and 2b, and a soft turn-off unit 9.

Control command unit 10 generates a control signal Sg in response to an ON/OFF command from the outside of drive control circuit 51. Control signal Sg is set at a logic high level (hereinafter also simply referred to as an "H level") or a logic low level (hereinafter also simply referred to as an "L level").

Control command unit 10 shifts control signal Sg from an H level to an L level when power semiconductor element 100 is instructed to be turned off. On the other hand, control signal Sg is shifted from an L level to an H level when power semiconductor element 100 is instructed to be turned on.

Voltage driver 3 includes semiconductor switches 21 and 22. Semiconductor switch 21 is connected between gate resistor 2a and a voltage node 19 that is for supplying a positive bias voltage Vp to gate 101 with respect to emitter 103. Semiconductor switch 22 is connected between gate resistor 2b and a voltage node 20 that is for supplying a negative bias voltage Vn to gate 101 with respect to emitter 103. By way of example, emitter 103 is set at 9 (V), voltage node 19 is set at 24 (V), and voltage node 20 is set at 0 (V), with the result that positive bias voltage Vp is set at 15 (V) and negative bias voltage Vn is set at −9 (V). In the following description, each semiconductor switch to be used is a semiconductor switching element such as a bipolar transistor or a MOSFET.

Semiconductor switch 21 is turned on and off in response to control signal Sg. On the other hand, semiconductor switch 22 is turned on and off in response to the output from inverter 23 to which control signal Sg is input. In other words, semiconductor switches 21 and 22 are turned on and off complementarily in response to control signal Sg.

When control signal Sg is set at an H level, semiconductor switch 21 is turned on, thereby connecting gate 101 to voltage node 19 through gate resistor 2a. This causes gate 101 to be shifted to positive bias voltage Vp, so that power semiconductor element 100 is turned on. The transition speed of the gate-emitter voltage in the turn-on transient, that is, the switching speed, varies in accordance with the gate resistance value (the resistance value of gate resistor 2a).

On the other hand, when control signal Sg is set at an L level, semiconductor switch 22 is turned on, thereby connecting gate 101 to voltage node 20 through gate resistor 2b. This causes gate 101 to be shifted to negative bias voltage Vn, so that power semiconductor element 100 is turned off. The transition speed of the gate-emitter voltage in the turn-off transient, that is, the switching speed, varies in accordance with the gate resistance value. In the following description, the voltage on gate 101 relative to emitter 103 (a gate-emitter voltage Vge) in power semiconductor element 100 is also simply referred to as a "gate voltage Vg".

Soft turn-off unit 9 includes a semiconductor switch 24 and a gate resistor 2c that are connected in parallel with gate resistor 2b. Semiconductor switch 24 is turned on and off in response to a protection signal S2 from a short-circuit protector 8 described later. When semiconductor switch 24 is turned on or off, the gate resistance value in the turn-off operation can be changed.

Specifically, when semiconductor switch 24 is turned on, gate resistors 2b and 2c connected in parallel with each other are included in a discharge path of gate 101. When semiconductor switch 24 is turned off, only gate resistor 2b is included in the discharge path of gate 101.

Accordingly, when semiconductor switch 24 is turned off, the gate resistance value increases as compared with the time when semiconductor switch 24 is turned on. This reduces the transient speed at which gate 101 changes toward negative bias voltage Vn (switching speed), so that power semiconductor element 100 is turned off slowly. Semiconductor switch 24 is turned on when power semiconductor element 100 is in the normal state. In contrast, semiconductor switch 24 is turned off in response to a protection signal S2 when the hard-switching fault is detected.

In this way, by shifting the voltage on gate 101 in response to control signal Sg according to an ON/OFF command, power semiconductor element 100 is controlled to be turned on and off. One embodiment of the "driver" can be configured by control command unit 10 and voltage driver 3.

The following is an explanation about the configuration of a circuit portion that is included in drive control circuit 51 and related to detection of the hard-switching fault. Drive control circuit 51 further includes a gate voltage detector 4, a delay signal generator 5, a subtractor 6, a short-circuit state detector 7, a sample and hold unit 18, and a short-circuit protector 8.

Gate voltage detector 4 generates a detection signal VG in accordance with gate voltage Vg. Detection signal VG is an analog voltage signal corresponding to gate voltage Vg. Delay signal generator 5 generates a delay signal dVG that is obtained by delaying detection signal VG by a prescribed delay time.

Figure 2:
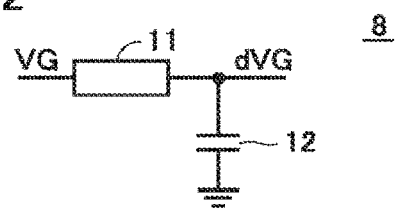
FIG. 2 is a circuit diagram showing a configuration example of a delay signal generator shown in FIG. 1.

FIG. 2 is a circuit diagram showing a configuration example of delay signal generator 5.

Referring to FIG. 2, delay signal generator 5 can be configured of an RC filter formed by a resistor 11 and a capacitor 12. When the RC filter is configured to receive an input as detection signal VG and provide an output as delay signal dVG, the delay time corresponding to the RC time constant obtained in accordance with the product of the resistance value of resistor 11 and the capacitance value of capacitor 12 can be applied between detection signal VG and delay signal dVG.

Again referring to FIG. 1, subtractor 6 outputs a voltage difference signal VD that is obtained by amplifying the voltage difference between detection signal VG from gate voltage detector 4 and delay signal dVG from delay signal generator 5.

Figure 3:
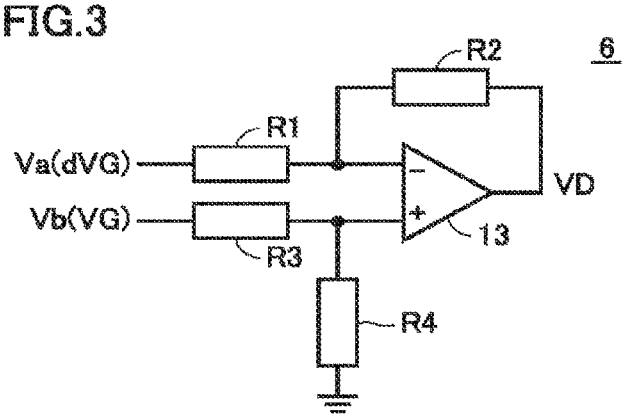
FIG. 3 is a circuit diagram showing a configuration example of a subtractor shown in FIG. 1.

FIG. 3 is a circuit diagram illustrating a configuration example of subtractor 6.

Referring to FIG. 3, subtractor 6 can be configured by a subtraction circuit obtained by differential amplification and formed of resistors R1 to R4 and an operational amplifier 13. It is known that, assuming that resistors R1 to R4 have resistance values $R_1$ to $R_4$, the following equation (1) is established among an input voltage Va to an inverted input terminal, an input voltage Vb to a non-inverted input terminal, and an output voltage Vc from the subtraction circuit.

$$V_c = \left(\frac{R_1 + R_2}{R_3 + R_4}\right)\frac{R_4}{R_1}V_b - \frac{R_2}{R_1}V_a \quad (1)$$

In the equation (1), assuming that the conditions $R_3=R_1$ and $R_4=R_2$ are satisfied, the following equation (2) is established.

$$V_c = \frac{R_2}{R_1}(V_b - V_a) \quad (2)$$

Accordingly, when detection signal VG is input into the non-inverted input terminal (Vb=VG) and delay signal dVG is input into the inverted input terminal (Va=dVG), voltage difference signal VD from subtractor 6 is represented by the following equation (3). In the equation (3), kg=(R2/R1), which corresponds to an amplification gain in the subtraction circuit.

$$VD = kg \cdot (VG - dVG) \quad (3)$$

Again referring to FIG. 1, short-circuit state detector 7 is configured by a voltage comparator (comparator). Short-circuit state detector 7 outputs a determination signal S0 in accordance with the comparison between voltage difference signal VD from subtractor 6 and a reference voltage VR1 from a reference voltage generator 17a. Reference voltage generator 17a is formed by a voltage divider connected between voltage node 19 and the ground of drive control circuit 51, or by a three-terminal regulator, and configured to output a constant DC voltage corresponding to reference voltage VR1.

For example, determination signal S0 is set at an H level on condition that VD>VR1. Then, determination signal S0 is set at an L level on condition that VD≤VR1. Sample and hold unit 18 outputs a signal S1 that holds determination signal S0 at an H level. When signal S1 changes into an H level, short-circuit protector 8 sets protection signal S2 from power semiconductor element 100 at an H level.

In this way, in drive control circuit 51 according to the first embodiment, based on the behavior of the difference signal between the detection signal of the gate-emitter voltage and the delay signal of the detection signal, it is determined whether power semiconductor element 100 is in the short-circuit state or not. This determination method will be described below.

Figure 4:
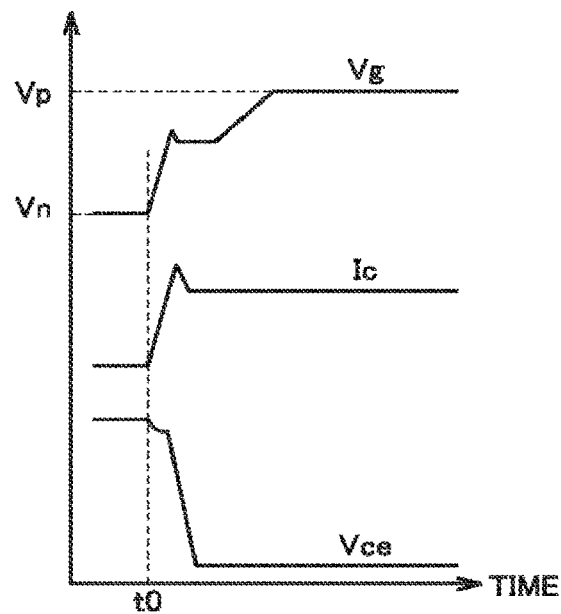
FIG. 4 is a conceptual waveform diagram illustrating behaviors of a voltage and a current at the time when the power semiconductor element is turned on under normal operation.

FIG. 4 is a conceptual waveform diagram illustrating the behaviors of a voltage and a current at the time when the power semiconductor element is turned on under normal operation.

Referring to FIG. 4, in response to an ON command, gate 101 is shifted to a positive bias voltage Vp at time t0. In response, gate voltage Vg rises, and also, power semiconductor element 100 is turned on. Accordingly, a collector current Ic rises while a collector-emitter voltage Vce falls.

At this time, in the normal state (that is, in the state where a short-circuit does not occur), there is a time period during which gate voltage Vg is kept at a fixed value (that is, a mirror period).

Figure 5:
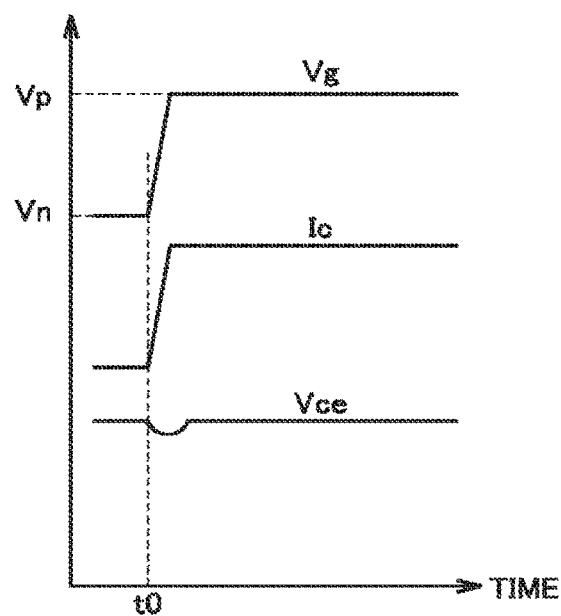
FIG. 5 is a conceptual waveform diagram illustrating the behaviors of a voltage and a current at the time when the power semiconductor element is turned on under hard-switching fault operation.

On the other hand, FIG. 5 shows a conceptual waveform diagram illustrating the behaviors of a voltage and a current at the time when the power semiconductor element is turned on under hard-switching fault condition.

Referring to FIG. 5, under the hard-switching fault condition, there is no mirror period, gate voltage Vg rises rapidly to positive bias voltage Vp, and an excessive collector current Ic flows.

In PTD 2, two types of electrical quantity (a gate-emitter voltage and a collector current) are detected. When gate voltage Vg is higher than a prescribed voltage value and when collector current Ic is higher than a prescribed current value, it is determined that the hard-switching fault occurs. On the other hand, in PTD 3, for detecting a hard-switching fault only based on the gate-emitter voltage, it becomes necessary to set the determination time period associated with the mirror period in the normal state, that is, to set a combination of time conditions, which may lead to failed detection or misdetection of the hard-switching fault.

Generally, in the SiC-MOSFET known as a power device that is useful for implementing a highly-efficient and downsized power converter, it is known that the gate-emitter voltage in the mirror period tends to rise slowly as compared with the characteristics in the IGBT (FIG. 5). Consequently, the gate-emitter voltage difference between the normal operation and the hard-switching fault is small. This may cause concern that it becomes relatively difficult to detect the hard-switching fault only based on the gate-emitter voltage.

Figure 6:
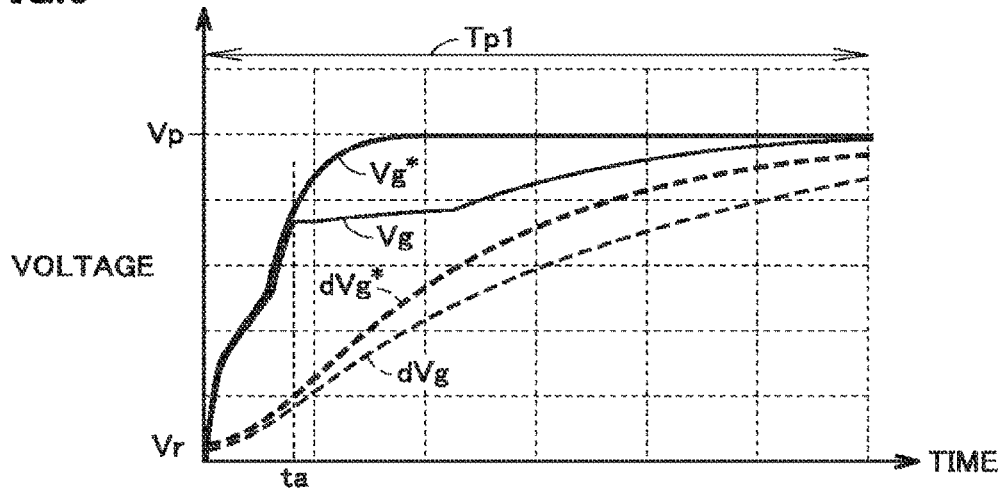
FIG. 6 is a waveform diagram for illustrating the behaviors of a gate-emitter voltage and its delay voltage in the drive control circuit according to the first embodiment.

FIG. 6 shows a waveform diagram for illustrating the behaviors of a gate-emitter voltage and its delay voltage in the drive control circuit according to the first embodiment. In FIG. 6, the simulation results using a certain power semiconductor element (IGBT) 100 and certain circuit parameters of drive control circuit 51 are compared between the normal operation and the hard-switching fault.

In FIG. 6, the horizontal axis shows a time axis, on which one scale corresponds to 1 (μs). FIG. 6 shows simulation waveforms of a gate voltage Vg in the normal operation and a gate voltage Vg* under the hard-switching fault. As apparent from the comparison between Vg and Vg*, the mirror period is started from time ta in the normal operation, but a voltage rapidly rises without an appearance of mirror period under the hard-switching fault.

Furthermore, FIG. 6 further shows the simulation results about delay voltage dVg and delay voltage dVg* obtained by adding a delay time in delay signal generator 5 (FIG. 2) to each of gate voltage Vg (the normal state) and gate voltage Vg* (the hard-switching fault), respectively. In this case, the RC time constant in delay signal generator 5 is defined as 2 (μs).

Figure 7:
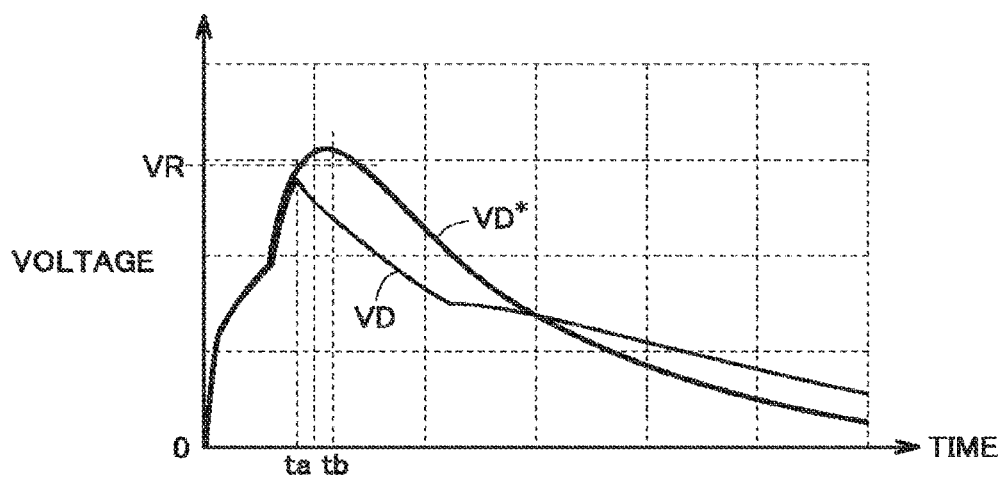
FIG. 7 is a waveform diagram for illustrating the behavior of a voltage difference signal in the drive control circuit according to the first embodiment.

FIG. 7 shows a waveform diagram for illustrating the behavior of a voltage difference signal in the drive control circuit according to the first embodiment. In FIG. 7, the simulation result of the voltage difference signal output from subtractor 6 is compared between the normal operation and the hard-switching fault. The same time scale is used in FIGS. 7 and 6.

Referring to FIG. 7, voltage difference signal VD is calculated by a difference (Vg−dVg) between delay voltage dVg and gate voltage Vg in the normal state shown in FIG. 6. On the other hand, voltage difference signal VD* is calculated by a difference (Vg*−dVg*) between Vg* and dVG* under the hard-switching fault shown in FIG. 6. In the circuit shown in FIG. 1, voltage difference signal VD is calculated from detection signal VG corresponding to gate voltages Vg and from delay signal dVG corresponding to delay voltages dVg.

At and after time ta, there occurs a difference in the behavior between voltage difference signal VD and VD*. Specifically, voltage difference signal VD in the normal state decreases continuously at and after time ta. In contrast, voltage difference signal VD* under the hard-switching fault increases also at and after time ta, and then starts to decrease at and after time tb. Accordingly, voltage difference signal VD does not reach the region of voltage difference signal VD* between time ta and time tb during the turn-on operation. In this way, it is understood that the voltage difference signal of the gate-emitter voltage has a voltage region that can be reached under the hard-switching fault but cannot be reached in the normal operation.

Consequently, it enables to determine that the hard-switching fault occurs only based on the maximum value (peak value) of the voltage difference signal from subtractor 6 but without providing a determination time period, that is, without having to combine time conditions. For example, as illustrated in FIG. 7, reference voltage VR for detecting the hard-switching fault can be set between the voltage value (VD*=VD) of the voltage difference signal at time ta and the peak value (VD*) of the voltage difference signal at time tb. Also, the voltage difference signal exceeds reference voltage VR immediately at the beginning of the mirror period (immediately after time ta).

It is necessary to appropriately set the delay time in delay signal generator 5 such that there is a difference in the maximum value (peak value) of the voltage difference signal between the normal operation and the hard-switching fault. Referring to FIG. 6, it is understood that, when the delay time of the gate-emitter voltage is too small, the voltage difference between the detection signal and the delay signal cannot be ensured. On the other hand, when the delay time is longer than the elapsed time period during which the gate-emitter voltage rises from negative bias voltage Vn to positive bias voltage Vp in the normal operation (Tp1 in FIG. 6; about 5 (μs)), the level of the voltage difference signal in the hard-switching fault cannot be ensured.

In the example shown in FIG. 6, delay signal generator 5 is configured by a first-order lag system formed of an RC filter, and the delay time is set so as to correspond to a time constant=2 (μs), thereby setting the delay time to be shorter than the above-described elapsed time period Tp1. This consequently causes an appropriate difference in the peak value of the voltage difference signal between the normal operation and the hard-switching fault, as shown in FIGS. 6 and 7. In addition, focusing attention on collector-emitter voltage Vce (FIG. 4) as a voltage difference between the "main terminals", the delay time in delay signal generator 5 can be set at a similar length to the above so that the delay time is set to be shorter than the elapsed time period until when collector-emitter voltage Vce becomes lower than a prescribed voltage.

Again referring to FIG. 1, in drive control circuit 51 according to the first embodiment, short-circuit state detector 7 formed of a voltage comparator sets determination signal S0 at an H level or an L level in accordance with the comparison between voltage difference signal VD from subtractor 6 and a reference voltage VR1. Reference voltage VR1 is set in accordance with reference voltage VR (FIG. 7) in consideration of the amplification gain and the like in subtractor 6.

Figure 8:
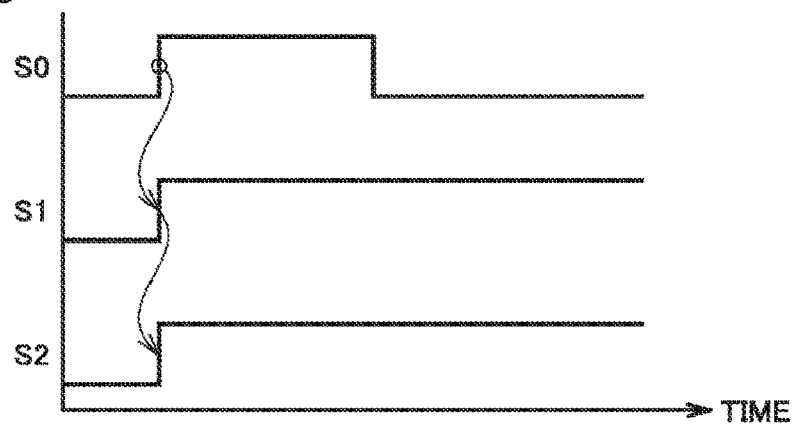
FIG. 8 is a waveform diagram of a signal showing the determination result in the drive control circuit according to the first embodiment.

FIG. 8 is a waveform diagram of a signal showing an example of the determination result in drive control circuit 51 according to the first embodiment. FIG. 8 shows the behavior of the signal at the time when the power semiconductor element 100 is in the short-circuit state.

Referring to FIG. 8, determination signal S0 from short-circuit state detector 7 is set at an H level in a time period during which voltage difference signal VD becomes higher than reference voltage VR1. Consequently, in the short-circuit operation, determination signal S0 changes from an L level to an H level at the timing of satisfying the condition of VD*>VR1 immediately after time ta in FIG. 7.

When determination signal S0 changes to an H level, signal S1 from sample and hold unit 18 is held at an H level after that. Thereby, occurrence of the hard-switching fault is recorded. When occurrence of the hard-switching fault is recorded, short-circuit protector 8 sets protection signal S2 at an H level.

In addition to an ON/OFF command from the outside, when protection signal S2 is set at an H level, control command unit 10 shifts control signal Sg to an L level. Thereby, an OFF command is issued equivalently so as to cause power semiconductor element 100 to be turned off. Thereby, power semiconductor element 100 can be turned off.

Furthermore, control command unit 10 fixes control signal Sg at an L level in the time period during which protection signal S2 is at an H level. Thereby, generation of an ON command is inhibited equivalently, thereby turning on power semiconductor element 100 for which the hard-switching fault has been detected. Consequently, generation of an overcurrent can be prevented.

For example, by applying a p-type MOSFET, semiconductor switch 24 of soft turn-off unit 9 is configured to be turned on at an L level of protection signal S2 and to be turned off at an H level of protection signal S2. Thereby, when power semiconductor element 100 for which the hard-switching fault has been detected is turned off, the gate-emitter voltage falls at a slow speed. Consequently, it enables to suppress a surge voltage generated across the collector and the emitter when power semiconductor element 100 is turned off.

In this way, according to the drive control circuit for the power semiconductor element in the present first embodiment, the gate-emitter voltage can be detected as an "electrical quantity of the control terminal", and based on the peak value of the difference signal between the detection signal of the electrical quantity and the delay signal, the hard-switching fault can be detected at the timing immediately after the beginning of the mirror period in the normal state. Thereby, only by detecting the gate-emitter voltage, and without having to combine time conditions, occurrence of the hard-switching fault can be immediately and accurately detected.

Also, power semiconductor element 100 can be protected from an overcurrent by providing a configuration for holding determination signal S0 from short-circuit state detector 7, and by forcing power semiconductor element 100 to turn off when detecting the hard-switching fault. Furthermore, soft turn-off unit 9 is operated to thereby suppress a surge voltage generated when power semiconductor element 100 is turned off. Consequently, power semiconductor element 100 can be protected.

Modification of First Embodiment

According to the modification of the first embodiment, another configuration example of subtractor 6 will be described.

Figure 9:
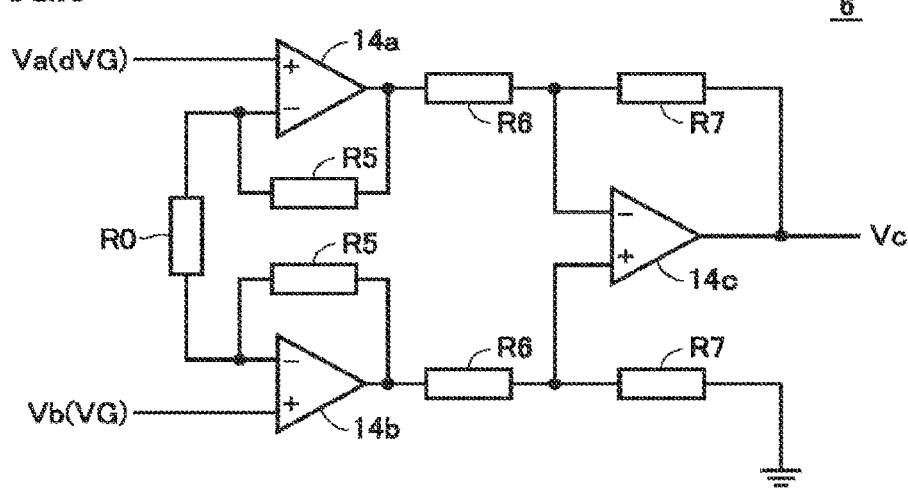
FIG. 9 is a circuit diagram showing another configuration example of the subtractor shown in FIG. 1.

FIG. 9 is a circuit diagram showing another configuration example of subtractor 6 shown in FIG. 1.

Referring to FIG. 9, subtractor 6 can be configured by the so-called instrumentation amplifier formed of resistors R0, R5 to R7 and operational amplifiers 14a to 14c. As compared with a subtraction circuit obtained by differential amplification shown in FIG. 3, the instrumentation amplifier can achieve a stabilized operation even in the electromagnetic noise environment. Accordingly, the instrumentation amplifier is often used in an industrial measuring circuit.

Assuming that the resistance values of resistors R0, R5, R6, and R7 are $R_0$, $R_5$, $R_6$, and $R_7$, respectively, the following equation (4) is established among input voltage Va to the non-inverted input terminal of operational amplifier 14a, input voltage Vb to the non-inverted input terminal of operational amplifier 14b, and output voltage Vc from subtractor 6.

$$V_c = \frac{R_7}{R_6}\left(1 + \frac{2R_5}{R_0}\right)(V_b - V_a) \quad (4)$$

Therefore, when the outputs from gate voltage detector 4 and delay signal generator 5 are input into subtractor 6 such that the conditions of Vb=VG and Va=dVG are achieved, voltage difference signal VD proportional to the voltage difference between detection signal VG and delay signal dVG can be obtained as in the above-described equation (3).

Consequently, in the configuration example in FIG. 1, even if the instrumentation amplifier shown in FIG. 9 is applied as subtractor 6, as in the first embodiment, occurrence of the hard-switching fault can be immediately and accurately detected based on the peak value of the voltage difference signal between the gate-emitter voltage and the delay signal of the gate-emitter voltage.

Second Embodiment

In the second embodiment, an explanation will be given with regard to the configuration for detecting a hard-switching fault based on the difference signal of the gate current (hereinafter also referred to as a "current difference signal") in place of the difference signal of the gate-emitter voltage.

Figure 10:
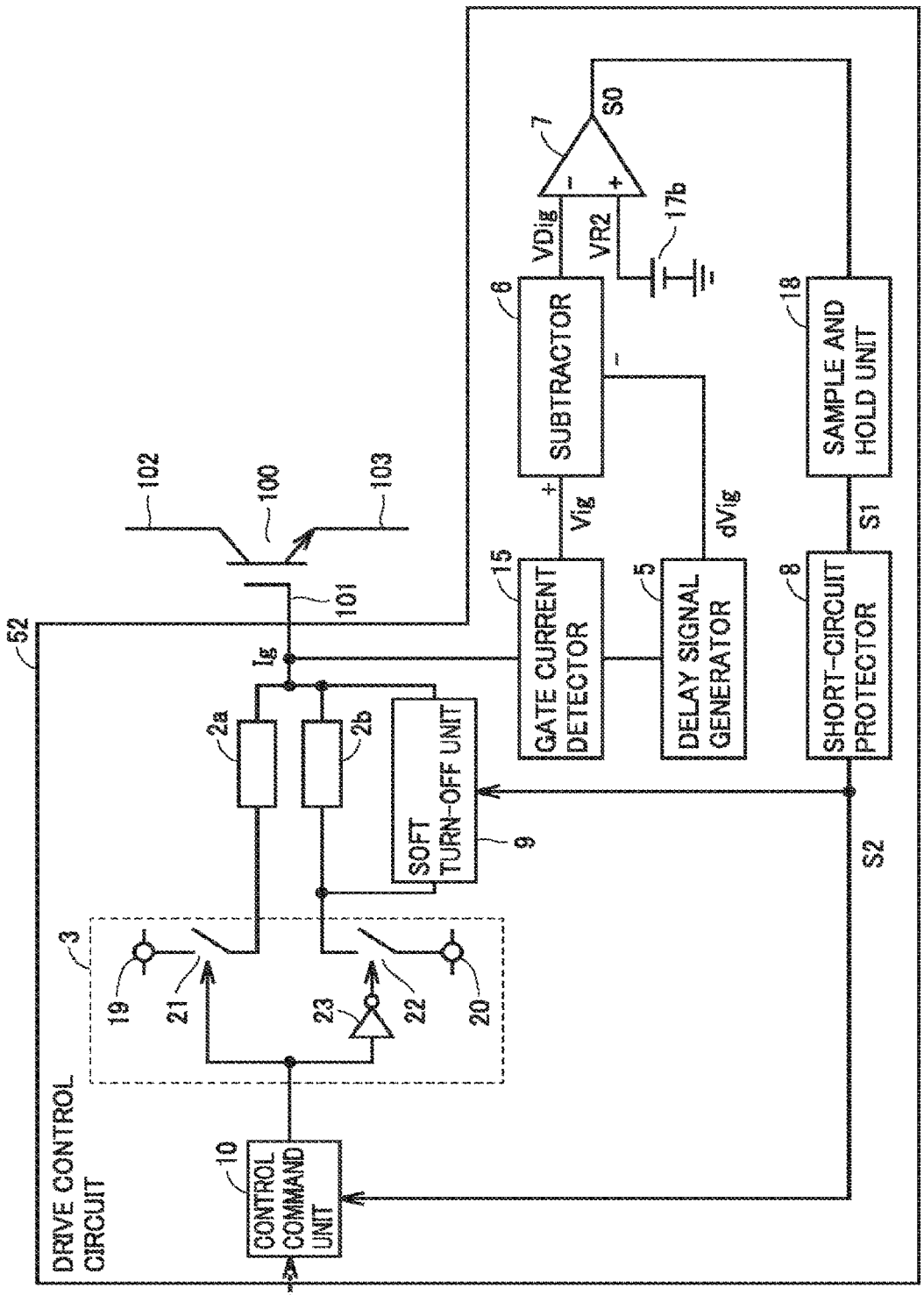
FIG. 10 is a block diagram showing the configuration of a drive control circuit for a power semiconductor element according to the second embodiment of the present invention.

FIG. 10 is a block diagram showing the configuration of a drive control circuit for a power semiconductor element according to the second embodiment of the present invention.

When comparing FIG. 10 with FIG. 1, a drive control circuit 52 according to the second embodiment is different from drive control circuit 51 according to the first embodiment in that drive control circuit 52 includes a gate current detector 15 and a reference voltage generator 17b in place of gate voltage detector 4 and reference voltage generator 17a, respectively. Since the configurations of other portions in drive control circuit 52 are the same as those in drive control circuit 51, the detailed description thereof will not be repeated. In other words, also in drive control circuit 52 according to the second embodiment, voltage driver 3 shifts the voltage on gate 101, thereby controlling power semiconductor element 100 to be turned on and off.

Gate current detector 15 can be formed, for example, by a current transformer (CT) and a Rogowski coil. Gate current detector 15 generates a detection signal Vig having a voltage value proportional to the gate current.

Delay signal generator 5 generates a delay signal dVig that is obtained by delaying a detection signal Vig from gate current detector 15 by a prescribed delay time. The delay time obtained by delay signal generator 5 is adjusted by the time constant of the RC filter in FIG. 2. Then, subtractor 6 outputs a current difference signal VDig that is obtained by amplifying the voltage difference between detection signal Vig from gate current detector 15 and delay signal dVig from delay signal generator 5. Subtractor 6 can also be formed by applying the circuit configuration shown in FIG. 3 or 9.

A short-circuit state detector 7 configured by a voltage comparator outputs a determination signal S0 based on the comparison between current difference signal VDig from subtractor 6 and a reference voltage VR2 from reference voltage generator 17b. Reference voltage generator 17b generates a reference voltage VR2 different from that generated by reference voltage generator 17a. Similar to reference voltage generator 17a, reference voltage generator 17b can be configured by a voltage divider, a three-terminal regulator, or the like.

Figure 11:
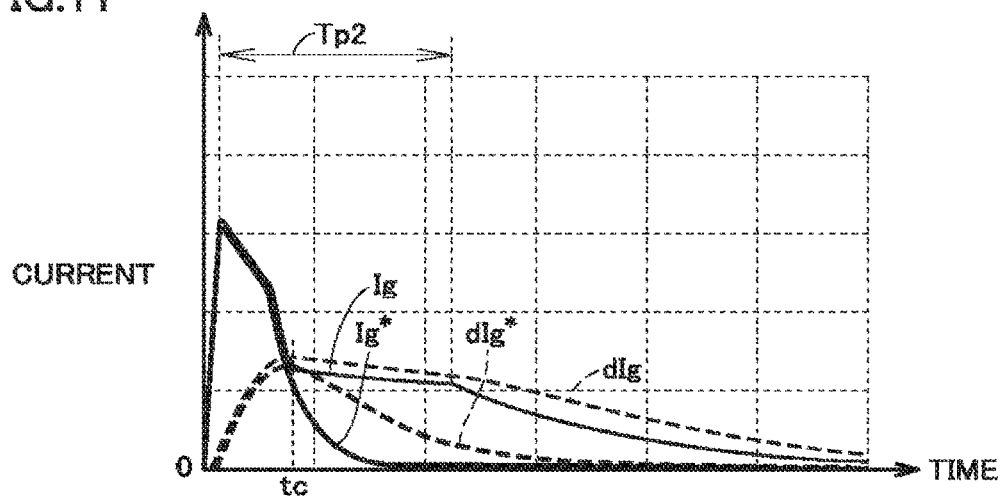
FIG. 11 is a waveform diagram for illustrating the behaviors of a gate current and its delay current in the drive control circuit according to the second embodiment.
Figure 12:
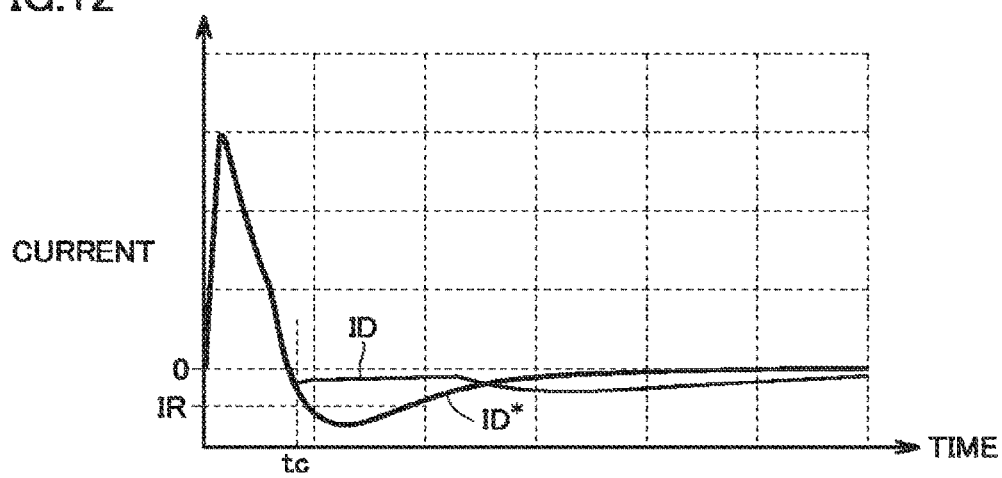
FIG. 12 is a waveform diagram for illustrating the behavior of a current difference signal in the drive control circuit according to the second embodiment.

Then, the behavior of the gate current in power semiconductor element (IGBT) 100 will be hereinafter described with reference to FIGS. 11 and 12. In FIGS. 11 and 12, the horizontal axis shows a common time axis, on which one scale corresponds to 1 (μs).

Furthermore, in FIGS. 11 and 12, each of a gate current Ig, its delay current dIg, and a current difference (Ig–dIg) therebetween is to be represented on a current value basis. In other words, in the circuit shown in FIG. 10, it enables to determine that the hard-switching fault occurs based on the above-described detection signal Vig, delay signal dVig and current difference signal VDig that represent voltage values corresponding to their respective current values.

FIG. 11 shows the simulation result of the gate current in the same turn-on operation as that in FIG. 6. Specifically, FIG. 11 further shows simulation waveforms of gate current Ig in the normal operation, gate current Ig* under the hard-switching fault, and delay currents dIg and dIg*.

As apparent from the comparison between gate currents Ig and Ig*, a mirror period appears from time tc in the normal operation, but a gate current continuously decreases without appearance of a mirror period under the hard-switching fault. It is to be noted that time tc is defined at the same timing as time ta in the gate-emitter voltage waveform (FIGS. 6 and 7).

Delay currents dIg and dIg* show the simulation result when gate currents Ig and Ig* are input into delay signal generator 5 (FIG. 2).

Also in the second embodiment, the delay time in delay signal generator 5 needs to be set appropriately such that there is a difference in the peak value of the current difference signal between the normal operation and the hard-switching fault. Specifically, as to the gate current, the level of the current difference signal under the hard-switching fault cannot be ensured, if the delay time is longer than the elapsed time period from when gate current Ig reaches the maximum value in the normal operation until the end of the mirror period during which the gate current is kept approximately constant (Tp2 in FIG. 11; about 2.0 (μs)).

In the examples in FIGS. 11 and 12, delay signal generator 5 (FIG. 2) is configured by a first-order lag system formed of an RC filter, and the delay time is set so as to correspond to a time constant=800 (ns), thereby setting the delay time to be shorter than the above-described elapsed time period Tp2. This consequently causes an appropriate difference in the peak value of the voltage difference signal between the normal operation and the hard-switching fault, as shown in FIGS. 6 and 7.

Referring to FIG. 12, a current difference ID is calculated from a difference (Ig–dIg) between a delay current dIg and gate current Ig in the normal operation, as shown in FIG. 11. On the other hand, a current difference ID* is calculated from a difference (Ig*–dIg*) between delay current dIg* and gate current Ig* under the hard-switching fault, as shown in FIG. 11.

At and after time tc, there occurs a difference in the behavior between current differences ID and ID*. Specifically, current difference ID in the normal state is kept approximately constant at and after time tc. In contrast, current difference ID* under the hard-switching fault further falls at and after time tc, and after that, starts to rise. Accordingly, the peak value (that is, a minimum value) in the negative current region of current difference ID* is to exist in the current region that current difference ID does not reach during the turn-on operation.

Therefore, as illustrated in FIG. 12, a reference current IR for detecting a hard-switching fault can be set between the current difference value (ID*=ID) at time tc and the peak value of ID*. Consequently, even if a gate current is detected, occurrence of the hard-switching fault can be determined based only on the peak value of the current difference signal from subtractor 6 without having to combine time conditions, as in the first embodiment.

Again referring to FIG. 10, when current difference signal VDig becomes lower than reference voltage VR2, short-circuit state detector 7 sets determination signal S0 at an H level. In consideration of the amplification gain and the like in subtractor 6, reference voltage VR2 is set in accordance with reference current IR (FIG. 12).

In addition, the peak value of the current difference in FIG. 12 is negative. In the configuration in FIG. 10, however, the destinations to which delay signal dVig and current difference signal VDig are input are replaced with each other in subtractor 6 (FIG. 3 or 9), with the result that current difference signal VDig in accordance with current difference ID can also be generated such that the peak value becomes positive. In this case, the destinations in short-circuit state detector 7 to which current difference signal VDig and reference voltage VR2 are input are replaced with each other. Reference voltage VR2 is also set to be a positive voltage.

Therefore, when the polarity of current difference signal VDig is the same as that in FIG. 12, and when reference voltage VR2 is a negative voltage, short-circuit state detector 7 sets determination signal S0 at an H level in the time period of VDig<VR2. On the other hand, when the polarity of current difference signal VDig is inverted and reference voltage VR2 is a positive voltage, short-circuit state detector 7 sets determination signal S0 at an H level in the time period of VDig>VR2. By appropriately replacing the polarity (+/− terminal) of the input to the voltage comparator forming short-circuit state detector 7, determination signal S0 can be generated with the same polarity as that in the first embodiment.

In this way, according to the drive control circuit for the power semiconductor element in the present second embodiment, even if the gate current is detected as an "electrical quantity of the control terminal", occurrence of a hard-switching fault can be immediately and accurately detected as in the first embodiment in which a gate-emitter voltage is detected. In other words, the hard-switching fault can be detected also only by detecting a gate current without having to combine time conditions.

Furthermore, in response to determination signal S0, each of sample and hold unit 18 and short-circuit protector 8 operates in the same manner as that in the first embodiment, thereby turning off power semiconductor element 100 in accordance with the operation of soft turn-off unit 9. Thereby, power semiconductor element 100 can be protected.

First Modification of Second Embodiment

Figure 13:
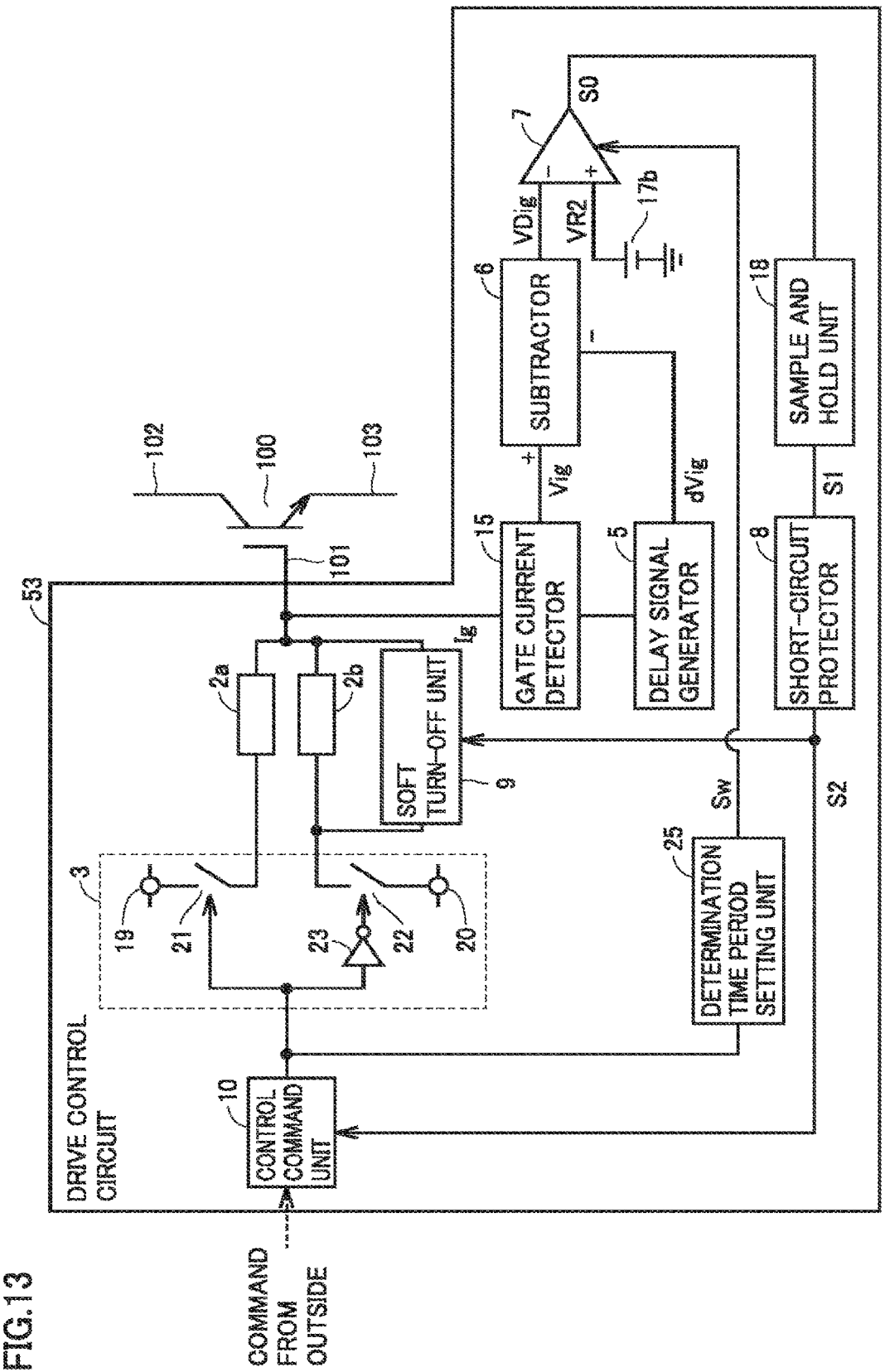
FIG. 13 is a block diagram showing the configuration of a drive control circuit for a power semiconductor element according to the first modification of the second embodiment of the present invention.

FIG. 13 is a block diagram showing the configuration of a drive control circuit for a power semiconductor element according to the first modification of the second embodiment of the present invention.

When comparing FIG. 13 with FIG. 10, drive control circuit 53 according to the first modification of the second embodiment is different from drive control circuit 52 according to the second embodiment in that drive control circuit 53 further includes a determination time period setting unit 25. Since the configurations of other portions in drive control circuit 53 are the same as those in drive control circuit 52, the detailed description thereof will not be repeated.

Determination time period setting unit 25 generates a signal Sw for setting a time period for a determination made by short-circuit state detector 7. In the time period during which signal Sw is at an H level, short-circuit state detector 7 operates as having been illustrated in the second embodiment. When current difference signal VDig exceeds reference voltage VR2, short-circuit state detector 7 sets determination signal S0 at an H level. On the other hand, short-circuit state detector 7 fixes determination signal S0 at an L level in the time period during which signal Sw is at an L level.

Figure 14:
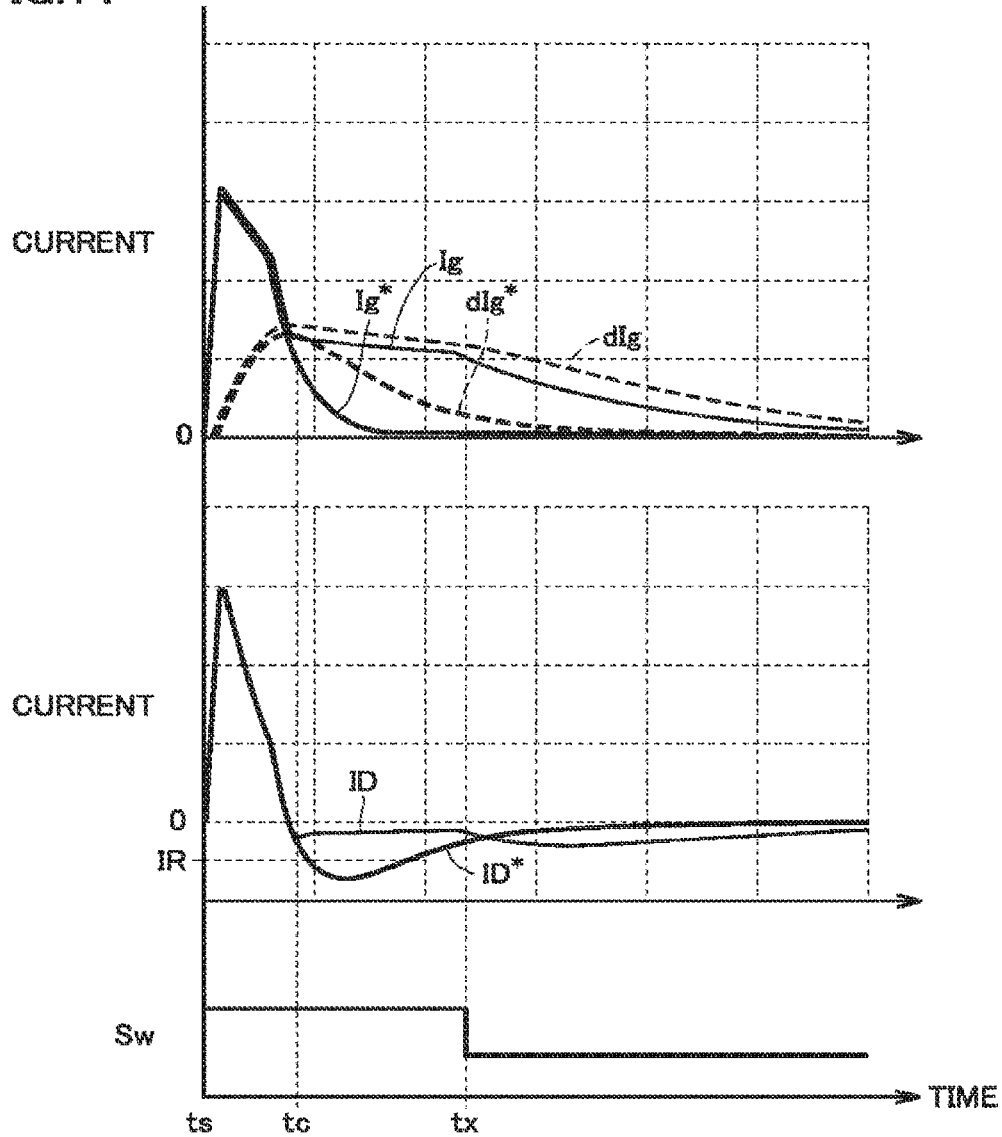
FIG. 14 is a waveform diagram for illustrating the operation of a determination period setting unit shown in FIG. 13.

FIG. 14 is a waveform diagram for illustrating the operation of determination time period setting unit 25. FIG. 14 shows the correspondence relation between the current behaviors (a gate current, a delay current, and a current difference) similar to those in FIGS. 11 and 12 and signal Sw from determination time period setting unit 25.

Referring to FIG. 14, signal Sw for setting a determination time period is set at an H level in the time period from time is at which a turn-on command is issued to time tx. Then, at and after time tx, signal Sw is set at an L level.

Time tx is set so as to correspond to the end timing of the mirror period during which gate current Ig in the normal state is kept approximately constant. Current difference ID becomes lower after time tx than before time tx, so that the difference between reference current IR and the peak value of current difference ID in the normal state is small. On the other hand, the negative peak value (minimum value) of current difference ID* in the hard-switching fault occurs before time tx. In addition, focusing attention on collector-emitter voltage Vce (FIG. 4) as a voltage difference between the "main terminals", time tx may be set at similar timing to the above, so that the time period to time tx is set to be shorter than the elapsed time period until when collector-emitter voltage Vce becomes lower than a prescribed voltage.

Therefore, by setting signal Sw such that the time period at and after time tx is excluded from the determination time period, the possibility of misdetecting a hard-switching fault can be reduced.

In this way, according to the drive control circuit in the first modification of the present second embodiment, a determination time period is limited, so that misdetecting of the hard-switching fault can be further prevented, in addition to the effect of the drive control circuit according to the second embodiment.

Second Modification of Second Embodiment

Figure 15:
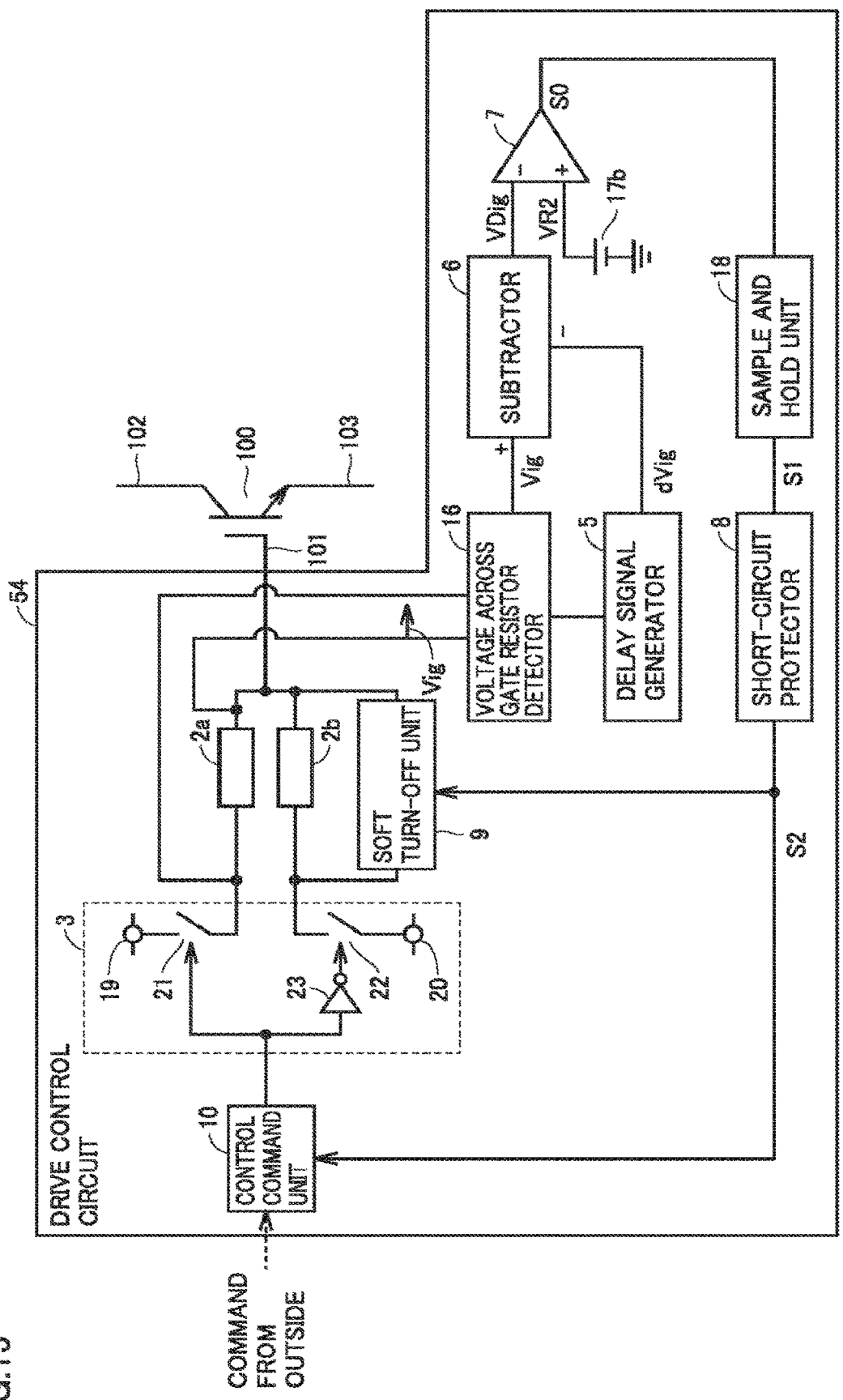
FIG. 15 is a block diagram showing the configuration of a drive control circuit for a power semiconductor element according to the second modification of the second embodiment of the present invention.

FIG. 15 is a block diagram showing the configuration of a drive control circuit for a power semiconductor element according to the second modification of the second embodiment of the present invention.

When comparing FIG. 15 with FIG. 10, a drive control circuit 54 according to the second modification of the second embodiment is different from drive control circuit 52 according to the second embodiment in that drive control circuit 54 includes a voltage across gate resistor detector 16 in place of gate current detector 15. Since the configurations of other portions in drive control circuit 54 are the same as those in drive control circuit 52, the detailed description thereof will not be repeated.

Voltage across gate resistor detector 16 detects a voltage across gate resistor 2a through which a current flows when the power semiconductor element is turned on, thereby equivalently detecting the gate current. Therefore, as with subtractor 6 for calculating a voltage difference, voltage across gate resistor detector 16 can be configured of a subtraction circuit obtained by differential amplification shown in FIG. 3, or of the instrumentation amplifier shown in FIG. 6. Specifically, in the configuration in FIG. 3 or 6, the voltage at one end connected to the gate terminal side of gate resistor 2a is input as an input voltage Va, and the voltage at the other end connected to the voltage driver side of gate resistor 2a is input as an input voltage Vb, with the result that detection signal Vig in accordance with the gate current can be obtained as an output voltage Vc.

In the same manner as with drive control circuit 52 according to the second embodiment, also in drive control circuit 54, the hard-switching fault can be detected using detection signal Vig from voltage across gate resistor detector 16.

In addition, in combination of the first modification and the second modification of the second embodiment, determination time period setting unit 25 shown in FIG. 13 can be arranged in drive control circuit 54, and short-circuit state detector 7 can also be operated only in a time period during which signal Sw is at an H level.

Third Embodiment

In the third embodiment, an explanation will be given with regard to the configuration for outputting the information about detection of the hard-switching fault to the outside from the drive control circuit according to the first and second embodiments and the modifications thereof. By outputting such information to the outside of the drive control circuit, this information can be provided, for example, for identifying the cause of failure in the power semiconductor element.

Figure 16:
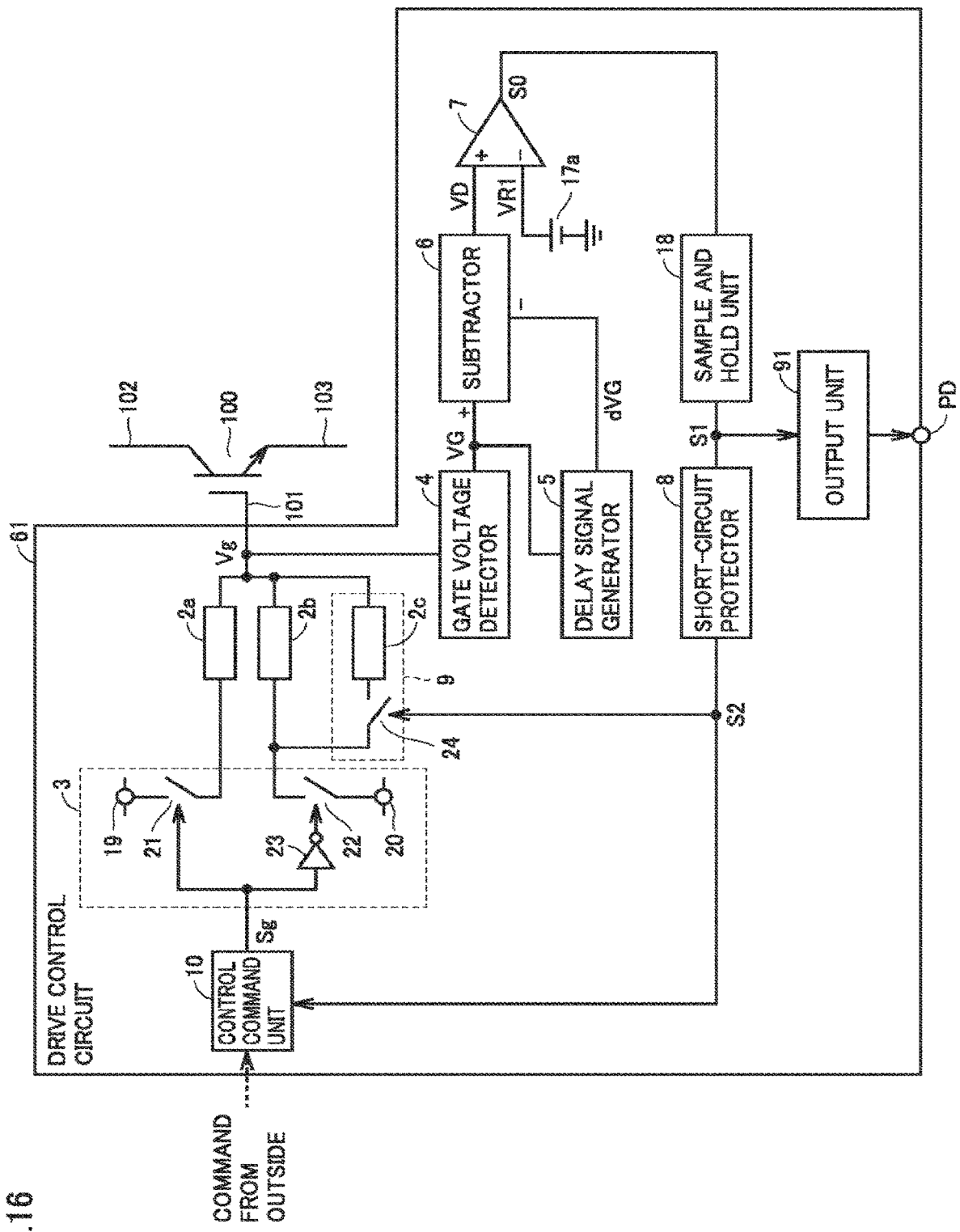
FIG. 16 is a block diagram showing the configuration of a drive control circuit for a power semiconductor element according to the third embodiment of the present invention.

FIG. 16 is a block diagram showing the configurations of a power semiconductor element and its drive control circuit according to the third embodiment of the present invention.

Referring to FIG. 16, drive control circuit 61 according to the third embodiment is different from drive control circuit 51 (FIG. 1) according to the first embodiment in that drive control circuit 61 further includes an output unit 91 and an output terminal PD.

Output unit 91 outputs a signal S1 from a sample and hold unit 18. As shown in FIG. 8, signal S1 is fixed at an H level after the hard-switching fault has been detected. Output terminal PD is configured to be able to be in electrically contact with the outside of drive control circuit 61.

Therefore, according to the drive control circuit in the third embodiment, by monitoring the voltage on output terminal PD from the outside of drive control circuit 61, it can be detected that the hard-switching fault has occurred in power semiconductor element 100.

Output unit 91 may output signal S1 showing the detection result of the hard-switching fault as an analog signal, or may output the digital signal in accordance with signal S1. In other words, output unit 91 can also be configured to output, to output terminal PD, a "0" value showing a normal state or a "1" value showing a hard-switching fault.

First Modification of Third Embodiment

Figure 17:
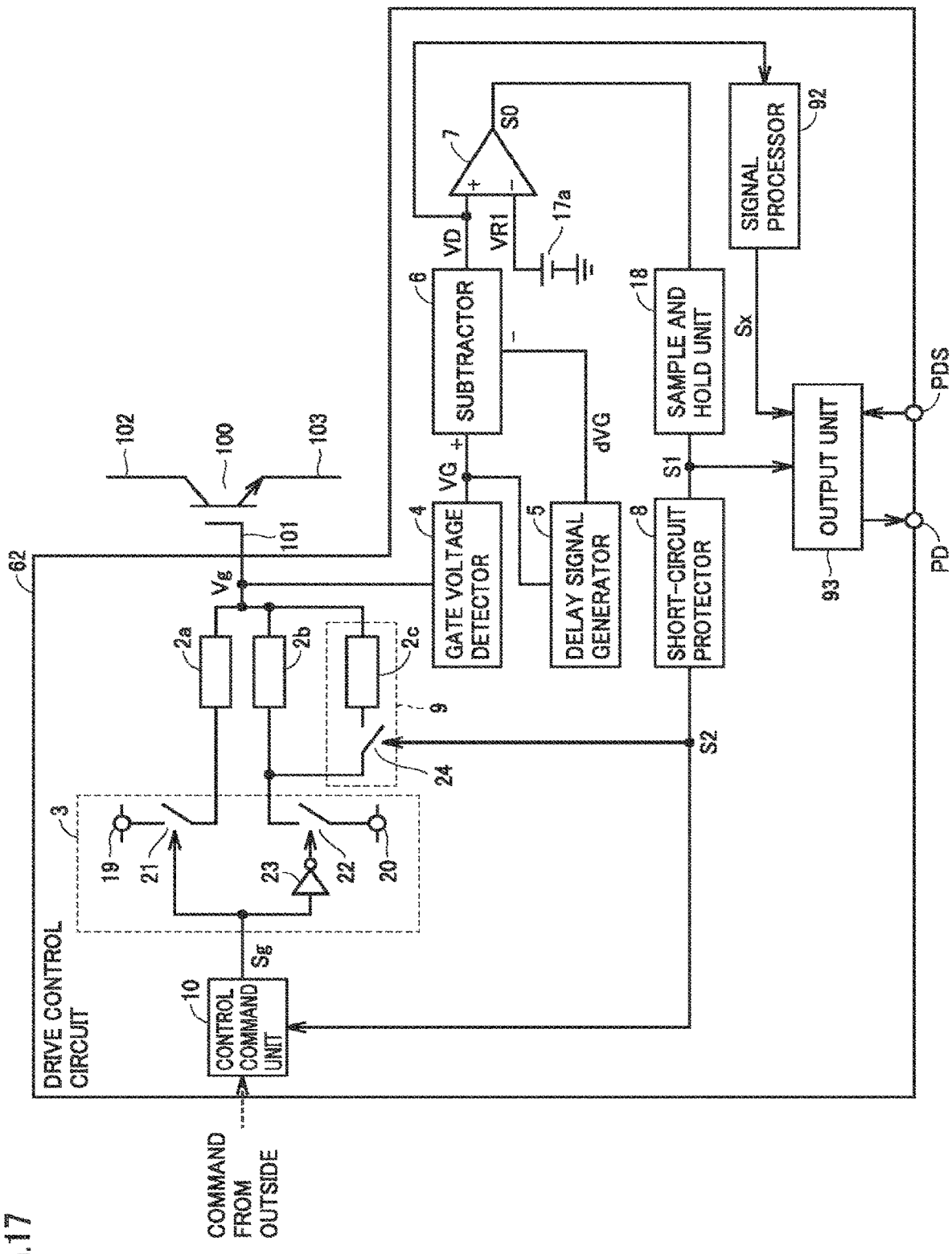
FIG. 17 is a block diagram showing the configuration of a drive control circuit for a power semiconductor element according to the first modification of the third embodiment of the present invention.

FIG. 17 is a block diagram showing the configuration of a drive control circuit for a power semiconductor element according to the first modification of the third embodiment of the present invention.

Referring to FIG. 17, drive control circuit 62 according to the first modification of the third embodiment is different from drive control circuit 51 (FIG. 1) according to the first embodiment in that drive control circuit 62 further includes a signal processor 92, an output unit 93, an output terminal PD, and a select terminal PDS. In other words, drive control circuit 62 is different from drive control circuit 61 (FIG. 16) in that drive control circuit 62 further includes a signal processor 92 and a select terminal PDS.

Select terminal PDS receives an input of select signal SL from the outside of drive control circuit 62 (for example, from a controller that is not shown). Select signal SL is used for selecting the data to be output from output terminal PD, and is configured by a 2-bit digital signal, for example.

In response to voltage difference signal VD from subtractor 6, signal processor 92 outputs a signal Sx showing its peak value. Signal Sx is, for example, an analog signal having a voltage in accordance with the peak value (the maximum value or the minimum value). As having been described with reference to FIG. 7, as to voltage difference signal VD, its maximum value is extracted as a peak value, so that the hard-switching fault can be detected. For example, signal processor 92 can be configured of a peak hold circuit.

FIG. 18 is a table showing the correspondence relation between select signal SL and output data from output terminal PD.

Referring to FIG. 18, when select signal SL is "00", output unit 93 does not output data to output terminal PD. When select signal SL is "01", output unit 93 outputs signal S1 from sample and hold unit 18 to output terminal PD.

When select signal SL is "10", output unit 93 outputs signal Sx from signal processor 92 to output terminal PD. Furthermore, when select signal SL is "11", output unit 93 outputs both signal S1 and signal Sx serially to output terminal PD.

FIG. 19 shows a diagram illustrating an example of the output of an analog signal from output terminal PD in drive control circuit 62 according to the first modification of the third embodiment.

Referring to FIG. 19(a), when the select signal is "01", output unit 93 outputs a pulse signal 151 having a duty ratio DT1 that varies in accordance with the level of signal S1. In other words, pulse signal 151 is generated such that an H level time period t becomes T×DT1 for a cycle T.

Referring to FIG. 19(b), when the select signal is "10", output unit 93 outputs a pulse signal 152 having a duty ratio DT2 that varies in accordance with signal Sx showing the peak value of voltage difference signal VD. In other words, pulse signal 152 is generated such that H level time period t becomes T×DT2 for cycle T.

For example, duty ratio DT2 is calculated by dividing a peak value (Sx) by a prescribed voltage Vx. For example, prescribed voltage Vx can be set to be higher than reference voltage VR1.

Referring to FIG. 19(c), when the select signal is "11", output unit 93 outputs serial pulse signals including pulse signal 151 as the first pulse and pulse signal 152 as the second pulse.

Figure 20:
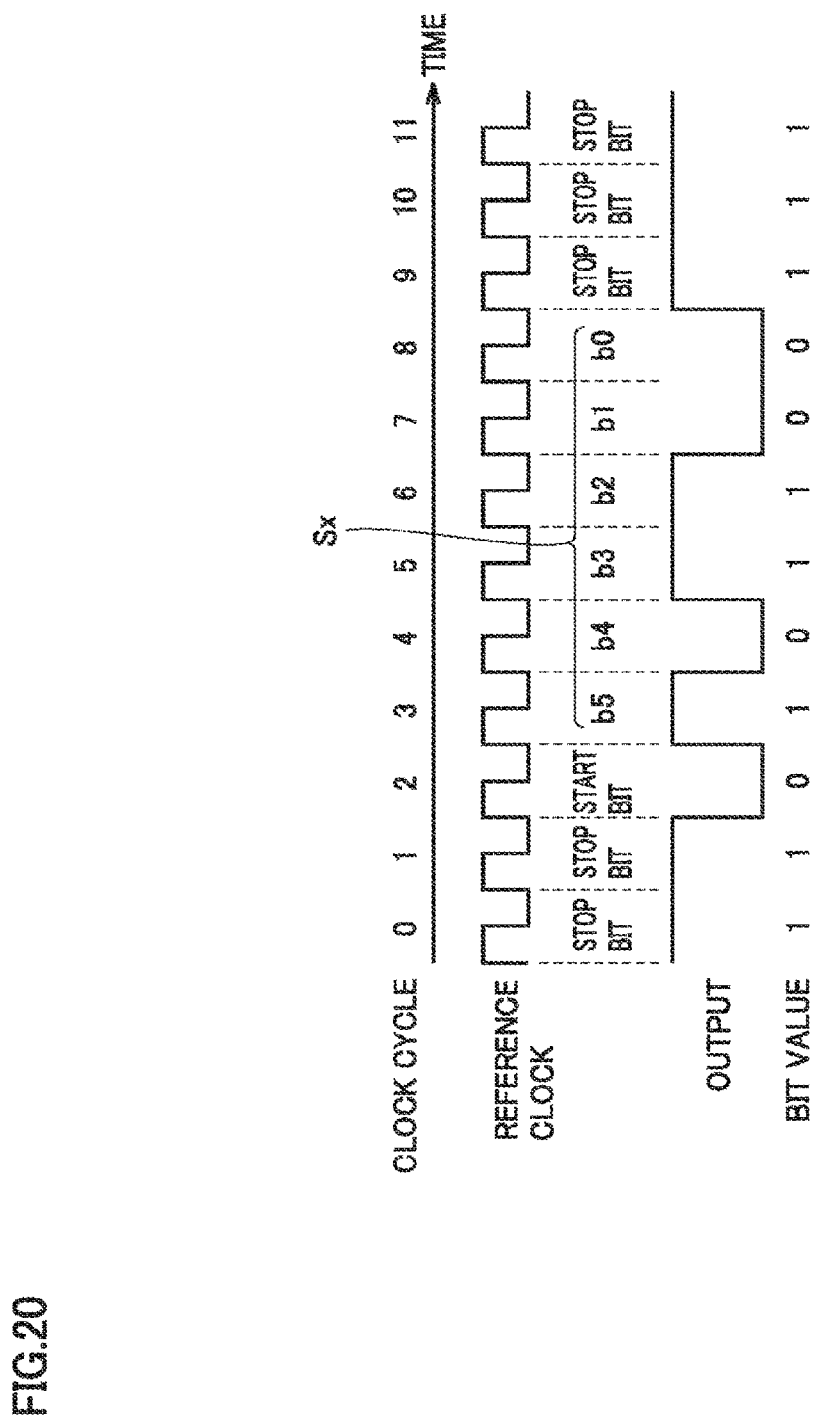
FIG. 20 is a diagram illustrating an example of the output data (digital) from the output terminal at the time when the select signal in the drive control circuit shown in FIG. 17 is "10".

FIG. 20 shows an output signal (digital) from output terminal PD at the time when the select signal is "10".

Referring to FIG. 20, when select signal SL is "10", output unit 93 generates a serial signal including a start bit, a plurality of bits obtained by performing A/D conversion of signal Sx (peak value) from signal processor 92, and a stop bit. The serial signal is output from output terminal PD. In the example in FIG. 20, signal Sx is converted into a 6-bit (a zeroth bit b0 to a fifth bit b5) digital signal.

In addition, the A/D conversion of the peak value of voltage difference signal VD may be performed in signal processor 92. In this case, signal processor 92 outputs signal Sx as a multiple-bit digital signal obtained by performing A/D conversion of the peak value.

Figure 21:
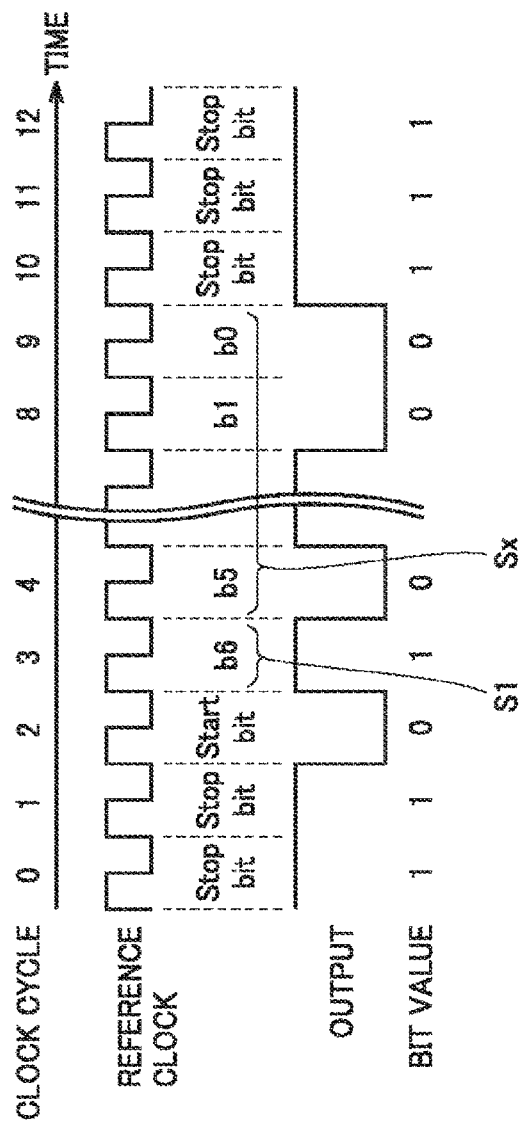
FIG. 21 is a diagram illustrating an example of the output data (digital) from the output terminal at the time when the select signal in the drive control circuit shown in FIG. 17 is "11".

FIG. 21 shows an output signal (digital) from output terminal PD at the time when the select signal is "11".

Referring to FIG. 21, when select signal SL is "11", output unit 93 generates a serial signal including: a start bit; a 1-bit digital signal obtained by performing A/D conversion of signal S1 from sample and hold unit 18; a digital signal obtained by performing A/D conversion of signal Sx (peak value) from signal processor 92 into multiple bits; and a stop bit. The serial signal is output from output terminal PD.

In the example in FIG. 21, signal S1 is output using a sixth bit b6, and signal Sx is output using 6 bits (zeroth bit b0 to fifth bit b5) as in FIG. 20.

On the other hand, when select signal SL is "00", output unit 93 does not output a signal to output terminal PD. Furthermore, when select signal SL is "01", output unit 91 generates a serial signal to output terminal PD. This serial signal includes a start bit, a 1-bit digital signal corresponding to a sixth bit b6 in FIG. 20, and a stop bit.

In this way, according to the drive control circuit in the first modification of the third embodiment, the detection result of the hard-switching fault (S1) and/or the peak value of the difference signal (Sx) can be read selectively by select signal SL that is input into select terminal PDS. Particularly, not only by the detection result (that is, hard-switching fault or not), but also by reading the peak value of voltage difference signal VD from the outside, such the peak value can be utilized, for example, for identifying the manner of failure in the power semiconductor element.

Second Modification of Third Embodiment

Figure 22:
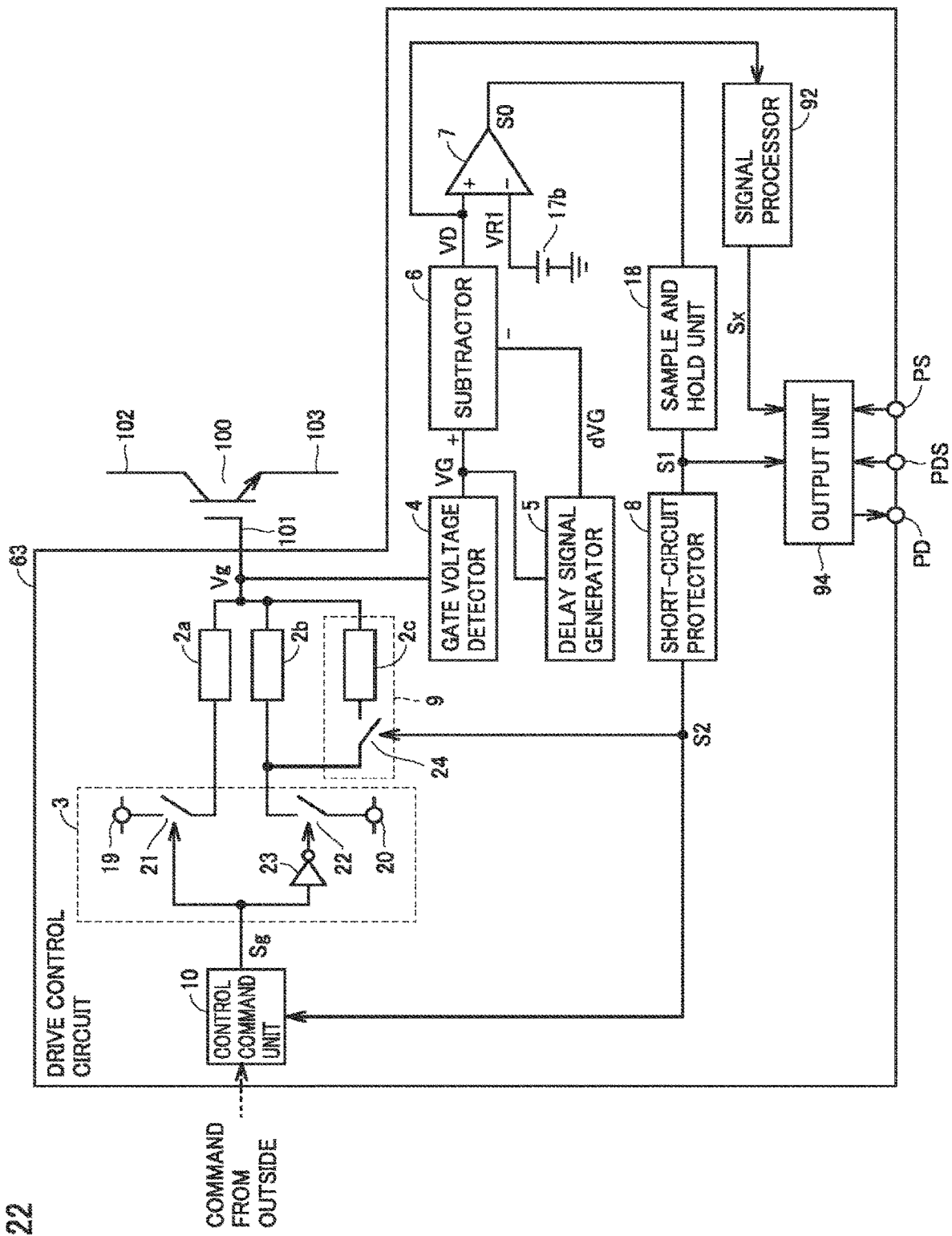
FIG. 22 is a block diagram showing the configuration of a drive control circuit for a power semiconductor element according to the second modification of the third embodiment of the present invention.

FIG. 22 is a block diagram showing the configuration of a drive control circuit for a power semiconductor element according to the second modification of the third embodiment of the present invention.

Referring to FIG. 22, a drive control circuit 63 according to the second modification of the third embodiment is different from drive control circuit 51 according to the first embodiment (FIG. 1) in that drive control circuit 63 further includes a signal processor 92, an output unit 94, an output terminal PD, a select terminal PDS, and a select terminal PS. Specifically, drive control circuit 63 is different from drive control circuit 62 (FIG. 17) in that it further includes select terminal PS.

Select terminal PS receives an input of a 1-bit select signal SE from the outside of drive control circuit 62. Select terminal PDS receives an input of a 2-bit select signal SL as in the first modification of the third embodiment.

Select signal SE is used for designating an analog signal (FIG. 19) or a digital signal (FIGS. 20 and 21) as an output signal from output unit 94. For example, when select signal SE is "1", output unit 94 outputs the detection result of the hard-switching fault (S1) and/or the peak value of the difference signal (Sx) in an analog signal format illustrated in FIG. 19 in accordance with the correspondence relation shown in FIG. 19.

On the other hand, when select signal SE is "0", output unit 94 outputs the detection result of the hard-switching fault (S1) and/or the peak value of the difference signal (Sx) in a digital signal format illustrated in FIGS. 22, 23 and the like in accordance with the correspondence relation shown in FIG. 19.

In this way, according to the drive control circuit in the second modification of the third embodiment, by the select signal input into select terminal PS, the detection result of the hard-switching fault (S1) and/or the peak value of the difference signal (Sx) can be output in an analog signal format or a digital signal format. Consequently, the flexibility of the drive control circuit for the failure analysis of the power semiconductor element is improved.

In each of the third embodiment and the modification thereof, an explanation has been given with regard to the configuration of drive control circuit 51 (FIG. 1) according to the first embodiment for outputting the information (signal S1 and/or Sx) about detection of the hard-switching fault to the outside. Such configuration can be similarly applied to the drive control circuit having been described in each of the first and second embodiments and the modifications thereof.

Furthermore, each of the embodiments and the modifications thereof can also be configured such that actuation of soft turn-off unit 9 (turning-off of semiconductor switch 24 (FIG. 1)) and turning-off of power semiconductor element 100 are instructed from the outside of the drive control circuit. In other words, short-circuit protector 8 inside the drive control circuit can also be configured such that only one of actuation of soft turn-off unit 9 and turning-off of power semiconductor element 100 is instructed.

Furthermore, in the present embodiment, a voltage-controlled type element (IGBT) having a gate as a control terminal has been described as a power semiconductor element. However, the drive control circuit according to each of the embodiments and the modifications thereof can also be applied to a current-controlled type element such as a bipolar transistor. The present invention can be applicable also to any current-controlled type element as long as a distinguishable difference occurs in the peak value of the difference signal between the normal state and the hard-switching fault, in which case the peak value of the difference signal lies between the detection signal of the electrical quantity (for example, a voltage or a current) in the control terminal (base) in the on state and its delay signal.

It should be understood that the embodiments disclosed herein are illustrative and non-restrictive in every respect. The scope of the present invention is defined by the terms of the claims, rather than the description above, and is intended to include any modifications within the meaning and scope equivalent to the terms of the claims.

REFERENCE SIGNS LIST 2a, 2b, 2c gate resistor, 3 voltage driver, 4 gate voltage detector, 5 delay signal generator, 6 subtractor, 7 short-circuit state detector, 8 short-circuit protector, 9 soft turn-off unit, 10 control command unit, 11 resistor (signal delay unit), 12 capacitor (signal delay unit), 13, 14a to 14c operational amplifier, 15 gate current detector, 16 voltage across gate resistor detector, 17a, 17b reference voltage generator, 18 sample and hold unit, 19, 20 voltage node, 21, 22, 24 semiconductor switch, 23 inverter, 25 determination time period setting unit, 51 to 54, 61 to 63 drive control circuit, 91, 93, 94 output unit, 92 signal processor, 100 power semiconductor element, 101 gate, 102 collector, 103 emitter, 151, 152 pulse signal, DT1, DT2 duty ratio (pulse signal), ID current difference, IR reference current, Ic collector current, Ig gate current, PD output terminal, PDS, PS select terminal, R0 to R7 resistor (subtractor), S0 determination signal, S1 signal (sample and hold unit), S2 protection signal, SE, SL select signal, Sg control signal, Sw signal (determination time period setting unit), Sx signal (peak value), T cycle, VD voltage difference signal, VDig current difference signal, VG, Vig detection signal, VR1, VR2 reference voltage (short-circuit state detector), Va, Vb input voltage (subtractor), Vc output voltage (subtractor), Vce collector-emitter voltage, Vg gate voltage, Vn negative bias voltage, Vp positive bias voltage, dig delay current, dVG, dVig delay signal, dVg delay voltage.

The invention claimed is:

1. A drive control circuit for a power semiconductor element including a control terminal, the drive control circuit comprising:
   a driver to operate to shift a voltage on the control terminal in response to an ON command or an OFF command;
   a detector configured to detect an electrical quantity of the control terminal;
   a delay signal generator configured to generate a delay signal obtained by adding a delay time to a detection signal of the electrical quantity detected by the detector;
   a subtractor configured to generate a difference signal between the detection signal and the delay signal; and
   a short-circuit state detector configured to detect a short-circuit state in the power semiconductor element based on a result of comparison between the difference signal and a reference value when the driver is operated in response to the ON command.

2. The drive control circuit for a power semiconductor element according to claim 1, wherein
   when a maximum value of the difference signal exceeds the reference value, or when a minimum value of the difference signal becomes lower than the reference value, the short-circuit state detector detects the short-circuit state.

3. The drive control circuit for a power semiconductor element according to claim 1, further comprising a sample and hold unit configured to, when a first level as a default state is shifted to a second level in response to detection of the short-circuit state by the short-circuit state detector, output a signal holding the second level.

4. The drive control circuit for a power semiconductor element according to claim 1, further comprising a short-circuit protector configured to generate the OFF command in response to detection of the short-circuit state by the short-circuit state detector.

5. The drive control circuit for a power semiconductor element according to claim 1, further comprising a soft turn-off unit configured to lower a speed of shifting the electrical quantity by the driver in response to the OFF command, wherein
the soft turn-off unit operates in response to detection of the short-circuit state by the short-circuit state detector.

6. The drive control circuit for a power semiconductor element according to claim 1, wherein
the power semiconductor element is a voltage-controlled type element that has the control terminal and two main terminals, the control terminal serving as a gate,
the driver is configured to shift a voltage on the gate to a first voltage in response to the ON command, and to shift the voltage on the gate to a second voltage in response to the OFF command, and
the electrical quantity is a gate-emitter voltage.

7. The drive control circuit for a power semiconductor element according to claim 6, wherein the delay time in the delay signal generator is set to be shorter than an elapsed time period during which the gate-emitter voltage changes from the second voltage to the first voltage by the driver in response to the ON command in a non-short-circuit state.

8. The drive control circuit for a power semiconductor element according to claim 1, wherein
the power semiconductor element is a voltage-controlled type element that has the control terminal and two main terminals, the control terminal serving as a gate,
the driver operates to shift a voltage on the gate to a first voltage in response to the ON command, and to shift the voltage on the gate to a second voltage in response to the OFF command, and
the electrical quantity is a gate current.

9. The drive control circuit for a power semiconductor element according to claim 8, wherein the delay time in the delay signal generator is set to be shorter than an elapsed time period from when the ON command is generated until when a voltage across the two main terminals of the power semiconductor element falls to a prescribed voltage, in a state where the driver operates in response to the ON command in a non-short-circuit state.

10. The drive control circuit for a power semiconductor element according to claim 8, further comprising a determination time period setting unit configured to set a determination time period during which the short-circuit state detector detects the short-circuit state, wherein
the determination time period setting unit is configured to set, as the determination time period, a time period from when the ON command is generated in a non-short-circuit state until when a voltage across the two main terminals of the power semiconductor element falls to a prescribed voltage.

11. The drive control circuit for a power semiconductor element according to claim 1, further comprising:
an output unit configured to output a signal showing a determination result obtained by the short-circuit state detector; and
an output terminal configured to output a signal from the output unit to an outside.

12. The drive control circuit for a power semiconductor element according to claim 1, further comprising:
a signal processor to generate a first signal showing a peak value that is a maximum value or a minimum value of the difference signal in response to the difference signal from the subtractor;
a select terminal to input, from an outside of the drive control circuit, a signal for designating at least one of the first signal and a second signal as a signal to be output, the second signal showing a determination result obtained by the short-circuit state detector;
an output unit configured to output at least one signal designated as the signal to be output among the first signal and the second signal in response to an input signal to the select terminal; and
an output terminal configured to output a signal from the output unit to the outside of the drive control circuit.

13. The drive control circuit for a power semiconductor element according to claim 12, wherein
the first signal is a digital signal including multiple bits that is obtained by analog-to-digital conversion of the peak value,
the second signal is a digital signal showing the determination result, and
the output terminal is configured to output a serial signal including the first signal and the second signal to the outside of the drive control circuit when the input signal designating the first signal and the second signal as the signal to be output is input to the select terminal.

* * * * *